(12) United States Patent
    Shinmura et al.

(10) Patent No.: US 9,084,352 B2
(45) Date of Patent: Jul. 14, 2015

(54) LID MEMBER WITH WATERPROOFING FUNCTION

(75) Inventors: Naoya Shinmura, Fujisawa (JP);
 Tsukasa Watanabe, Fujisawa (JP);
 Hiroki Matsumoto, Fujisawa (JP)

(73) Assignee: Nippon Mektron, Ltd. (JP)

( * ) Notice: Subject to any disclaimer, the term of this patent is extended or adjusted under 35 U.S.C. 154(b) by 0 days.

(21) Appl. No.: 14/362,829

(22) PCT Filed: Jun. 19, 2012

(86) PCT No.: PCT/JP2012/065564
 § 371 (c)(1),
 (2), (4) Date: Jun. 4, 2014

(87) PCT Pub. No.: WO2013/084527
 PCT Pub. Date: Jun. 13, 2013

(65) Prior Publication Data
 US 2014/0331562 A1    Nov. 13, 2014

(30) Foreign Application Priority Data

Dec. 8, 2011    (JP) ................. 2011-268710

(51) Int. Cl.
 *G06F 1/16*    (2006.01)
 *H05K 5/02*    (2006.01)
 (Continued)

(52) U.S. Cl.
 CPC .......... *H05K 5/0239* (2013.01); *H01R 13/5202* (2013.01); *H01R 13/5213* (2013.01); *H04M 1/18* (2013.01); *H05K 5/03* (2013.01); *H05K 5/061* (2013.01); *H01R 2201/16* (2013.01); *H04M 1/0249* (2013.01)

(58) Field of Classification Search
 CPC ....... H05K 5/0239; H05K 5/03; H05K 5/061; H01R 13/5213; H01R 2201/16; H01R 13/5202; H04M 1/0249; H04M 1/18
 USPC .................. 455/575.1; 361/600, 601, 679.01, 361/679.4, 437
 See application file for complete search history.

(56) References Cited

U.S. PATENT DOCUMENTS 5,324,207 A    6/1994  Itoh et al.
7,941,196 B2 *  5/2011  Kawasaki et al. .......... 455/575.8
 (Continued)

FOREIGN PATENT DOCUMENTS

EP    0509454 A2    10/1992
JP    H04-121470 U   10/1992
 (Continued)

*Primary Examiner* — Jerry Redman
(74) *Attorney, Agent, or Firm* — Harness, Dickey & Pierce, P.L.C.

(57) ABSTRACT

In a lid member with a waterproofing function, the lid member including a projection portion integrally formed in one surface of a resin main body of the lid member opening and closing an opening portion formed in a housing, and accommodated in the opening portion, and a seal portion integrally formed in an outer peripheral surface of the projection portion, provided with an annular projection coming into close contact with a peripheral surface of the opening portion, and made of a rubber-like elastic material, the annular projection is formed as a shape which is expanded toward an inner portion side of the opening portion, forms in its outer peripheral surface a taper surface which converges toward the inner portion side, and is provided with a seal surface having a circular arc shaped cross section so as to be connected to a maximum diameter portion of the taper surface.

8 Claims, 5 Drawing Sheets

(51) Int. Cl.
*H01R 13/52* (2006.01)
*H04M 1/18* (2006.01)
*H05K 5/03* (2006.01)
*H05K 5/06* (2006.01)
*H04M 1/02* (2006.01)

(56) References Cited

U.S. PATENT DOCUMENTS

| | | | | |
|---|---|---|---|---|
| 8,315,051 | B2* | 11/2012 | Kim et al. | 361/679.56 |
| 2006/0166711 | A1* | 7/2006 | Schworm | 455/575.1 |
| 2008/0058036 | A1* | 3/2008 | Nibe | 455/575.1 |
| 2010/0285850 | A1* | 11/2010 | Paleczny et al. | 455/575.1 |
| 2013/0244737 | A1* | 9/2013 | Tanaka et al. | 455/575.1 |
| 2014/0087792 | A1* | 3/2014 | Park | 455/575.1 |

FOREIGN PATENT DOCUMENTS

| | | |
|---|---|---|
| JP | 11-135195 A | 5/1999 |
| JP | 2006-084438 A | 3/2006 |
| JP | 2009-043773 A | 2/2009 |
| JP | 2010-186562 A | 8/2010 |

* cited by examiner

LID MEMBER WITH WATERPROOFING FUNCTION

CROSS-REFERENCE TO RELATED APPLICATIONS

This application is a U.S. National Stage Application of International Application No. PCT/JP2012/065564 filed on Jun. 19, 2012, and published in Japanese as WO 2013/084527 A1 on Jun. 13, 2013. This application claims priority to Japanese Application No. 2011-268710 filed on Dec. 8, 2011. The disclosures of the above applications are incorporated herein by reference.

BACKGROUND OF THE INVENTION

1. Field of the Invention

The present invention relates to a lid member with a waterproofing function for an electronic device, and more particularly to a structure for sealing so as to prevent water droplet from intruding into an inner portion of the electronic device, for example, a mobile phone terminal.

Accordingly, the lid member with the waterproofing function according to the present invention is preferably utilized as a seal structure of a connector portion of the waterproofing electronic device.

2. Description of the Conventional Art

Conventionally, a connector lid for opening and closing a connector is provided in a portable terminal.

In other words, the connector lid for opening and closing a communication port for the connector is fixed and retained to a housing (a case) side by a flexible band portion which is formed as a band shape or a circular shape.

Further, a small rib-shaped seal ring portion is formed in a peripheral side surface of the connector lid occluding the connector over its whole periphery.

As a result, the connector lid carries out a function of sealing the communication port for the connector in a water-tight manner.

This kind of connector lid is specifically structured, for example, such that a waterproofing plug is integrally formed in the connector lid according to an ultrasonic welding, the waterproofing plug being obtained by insert molding a rubber packing which is formed by a silicone rubber, around a plug member which is formed in an inner side of the lid member formed by a polycarbonate (Japanese Unexamined Patent Publication No. 2006-84438).

However, since the waterproofing plug exists in the inner side of the connector lid, there has been brought about a problem that a thickness of a whole of the connector lid is increased, and a manufacturing cost is increased.

Consequently, there has been offered a suggestion that a thin waterproofing structure of the connector lid is achieved by integrating a seal portion 300 which is a waterproofing member and is made of a rubber-like elastic material, with a connector lid main body 2 which is made of a resin material, as shown in FIG. 6 (Japanese Unexamined Patent Publication No. 2010-186562).

In other words, this kind of lid member with the waterproofing function is constructed by a projection portion 21 which is integrally formed in one surface of a resin main body 2 of a lid member opening and closing an opening portion 11 formed in a housing 1 and is accommodated in the opening portion 11, and a seal portion 300 which is integrally formed in an outer peripheral surface 211 of the projection portion 21 and is provided with an annular projection portion 310 coming into close contact with a peripheral surface 12 of the opening portion 11.

However, the portable terminal device is going to be requested to be lightened and thinned more and more, and the connector lid provided in the side surface of the portable terminal device is necessarily going to be downsized.

As a result, when this kind of lid member with the waterproofing function is inserted into the opening portion 11 formed in the housing 1, the seal portion 300 is deformed by an end portion 13 of the housing 1, as shown in FIG. 7.

Since the connector lid is downsized, there has been brought about a problem that the lid member is pushed back and can not be capped as well as an inserting amount of the lid member with the waterproofing function in relation to the opening portion 11 can not be sufficiently secured.

Accordingly, there has been made an attempt to reduce an amount at which the seal portion 300 comes into contact with the peripheral surface 12 of the opening portion 11 (a crushing margin of the seal portion 300), however, a contact pressure of the seal portion 300 in relation to the peripheral surface 12 is lowered, so that it has been hard to secure a stable seal performance.

SUMMARY OF THE INVENTION

Problem to be Solved by the Invention

An object of the present invention is to secure a stable seal performance of a seal portion as well as reducing an insertion resistance of a lid member.

Means for Solving the Problem

In order to achieve the object mentioned above, according to the present invention, there is provided a lid member with a waterproofing function, the lid member including a projection portion which is integrally formed in one surface of a resin main body of the lid member opening and closing an opening portion formed in a housing, and is accommodated in the opening portion, and a seal portion which is integrally formed in an outer peripheral surface of the projection portion, is provided with an annular projection coming into close contact with a peripheral surface of the opening portion, and is made of a rubber-like elastic material, wherein the annular projection is formed as a shape which is expanded toward an inner portion side of the opening portion, forms in its outer peripheral surface a taper surface which converges toward the inner portion side, and is provided with a seal surface having a circular arc shaped cross section so as to be connected to a maximum diameter portion of the taper surface.

Effect of the Invention

The present invention achieves the following effects.

According to the lid member with the waterproofing function of the invention described in the first aspect of the present disclosure, it is possible to secure a stable seal performance of the seal portion as well as reducing an insertion resistance of the lid member.

Further, according to the lid member with the waterproofing function of the invention described in the second aspect of the present disclosure, it is possible to secure the stable seal performance of the seal portion as well as more securely reducing the insertion resistance of the lid member.

Further, according to the lid member with the waterproofing function of the invention described in the third aspect of the present disclosure, since the insertion of the lid member is guided by the taper surface, it is possible to smoothly carry out the insertion of the lid member.

Further, according to the lid member with the waterproofing function of the invention described in the fourth aspect of the present disclosure, since the insertion of the lid member is smoothly guided by the taper surface, it is possible to smoothly and securely carry out the insertion of the lid member.

Further, according to the lid member with the waterproofing function of the invention described in the fifth aspect of the present disclosure, it is possible to securely achieve the stable seal performance of the seal portion as well as more reducing the insertion resistance of the lid member.

DETAILED DESCRIPTION OF PREFERRED EMBODIMENTS

A description will be given below of the best mode for carrying out the present invention.

Figure 1:
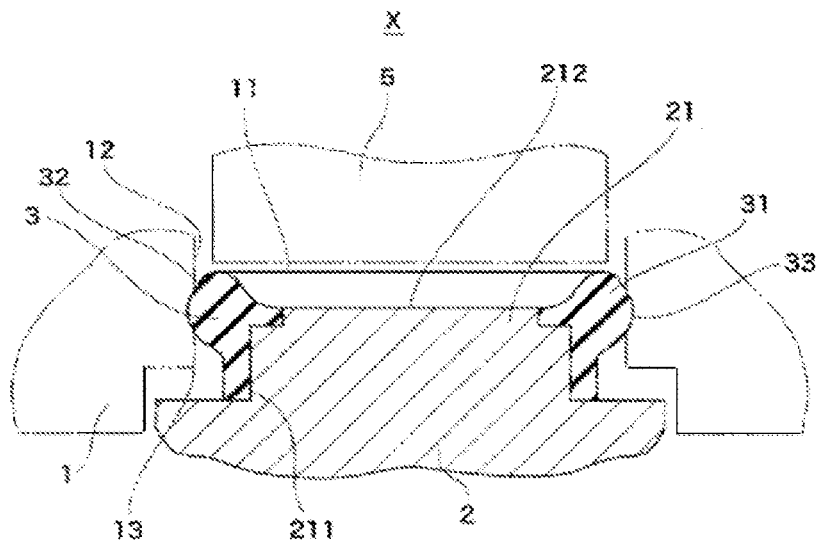
FIG. 1 is a vertical cross sectional view of a lid member with a waterproofing function according to the present invention.
Figure 2:
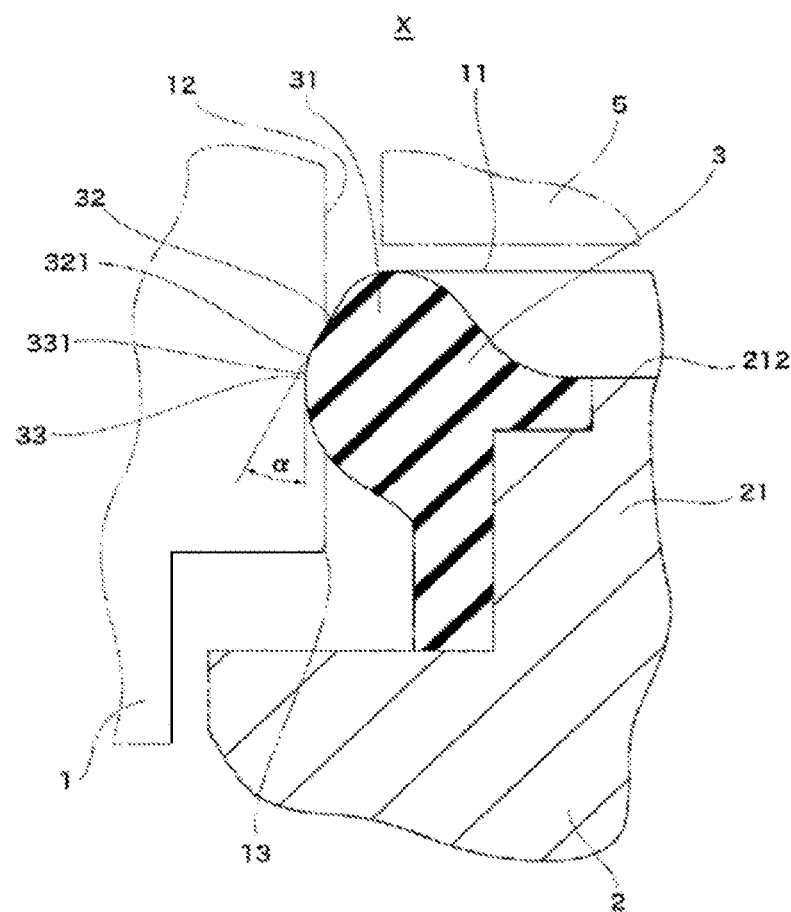
FIG. 2 is a partly enlarged view of FIG. 1.
Figure 3:
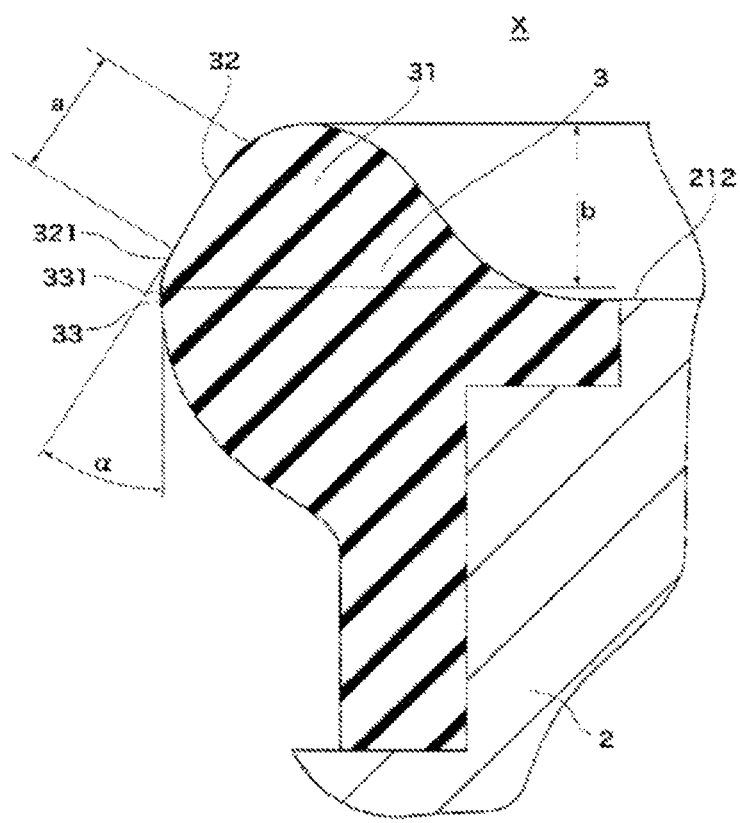
FIG. 3 is a view in which only a seal portion in FIG. 2 is enlarged.

A lid member with a waterproofing function according to the present invention is used for opening and closing an opening portion 11 which is formed in a housing 1 forming a casing of a device of a portable terminal, as shown in FIGS. 1 to 3.

A connector 5 is arranged in the opening portion 11.

Further, the lid member with the waterproofing function according to the present invention is provided with a projection portion 21 which is integrally formed in one surface of a resin main body 2 of the lid member opening and closing the opening portion 11 formed in he housing 1, and is accommodated within the opening portion 11, and a seal portion 3 which is integrally formed in an outer peripheral surface 211 of the projection portion 21, is provided with an annular projection 31 coming into close contact with a peripheral surface 12 of the opening portion 11, and is made of a rubber-like elastic material.

Further, the annular projection 31 is formed as a shape which is expanded toward an inner portion X side of the opening portion 11.

Further, the annular projection 31 forms in its outer peripheral surface a taper surface 32 which is converged toward the inner portion X side, and is provided with a seal surface 33 having a circular arc cross sectional shape so as to be connected to a maximum diameter portion 321 of the taper surface 321.

According to the structure mentioned above, in the case that the opening portion 11 is closed by the lid member, an end portion 13 of the housing 1 comes into contact with the taper surface 32, and the end portion 13 can smoothly move along the taper surface 32. Therefore, it is possible to reduce an insertion resistance of the lid member.

Further, even after the end portion 13 passes through the taper surface 32, the end portion 13 can smoothly move since the seal surface 33 having the circular arc cross sectional shape is formed so as to be connected to the maximum diameter portion 321 of the taper surface. After the end portion 13 passes through the maximum diameter portion 331, the seal surface 33 including the maximum diameter portion 331 can achieve a good close contact state with the peripheral surface 12 of the opening portion 11. Therefore, it is possible to secure a stable seal performance of the seal portion 3.

Further, the maximum diameter portion 331 of the seal surface 33 having the circular arc cross sectional shape is designed so as to be positioned at the same position as the position of the end surface 212 of the projection portion 21 or be positioned closer to the inner portion X side than the end surface 212.

Figure 4:
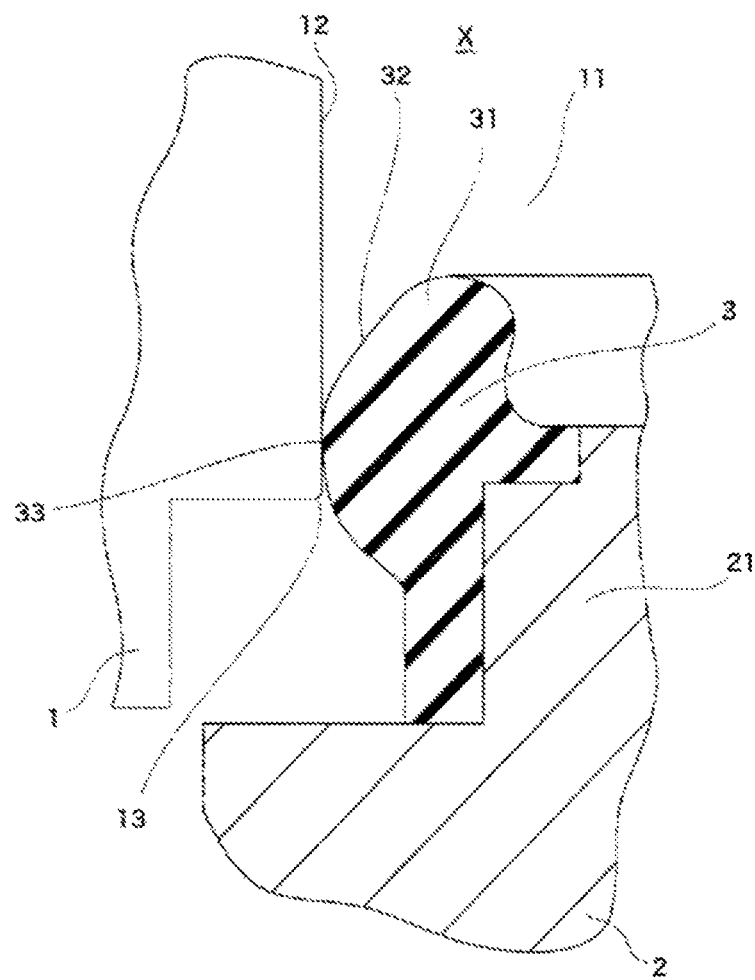
FIG. 4 is a partly enlarged view showing a deformed state of a seal portion in the case that the lid member in FIG. 1 is inserted into an opening portion.

As a result, since the annular projection 31 of the seal portion 3 is deformed as shown in FIG. 4 in the case that the seal portion 3 comes into contact with the peripheral surface 12 of the opening portion 11 formed in the housing 1, the lid member is never pushed back.

Further, as mentioned above, the taper surface 32 is designed so as to have such dimension and shape that the end portion 13 of the peripheral surface 12 of the housing 1 first comes into contact with the taper surface 32 in the case that the lid member closes the opening portion 11.

As a result, since the insertion of the lid member is guided by the taper surface 32, it is possible to smoothly carry out the insertion of the lid member.

Further, a taper angle α which the taper surface 32 forms with the peripheral surface 12 of the housing 1 is designed in a range between 20 and 50 degrees in a free state of the seal portion 3.

In the case that the taper angle is smaller than 20 degrees, a width in a diametrical direction of the taper surface 32 becomes smaller. As a result, there is a risk that a state in which the end portion 13 does not come into contact with the taper surface 32 is brought about, due to dispersion in precision of the member.

On the other hand, in the case that the taper angle is larger than 50 degrees, the insertion resistance of the lid member becomes larger, and it is impossible to smoothly insert the lid member.

Further, it is preferable to use JIS A55-85 as a rubber hardness of the seal portion 3.

If the rubber hardness is softer than JIS A55, a sufficient seal surface pressure can not be obtained in relation to the peripheral surface 12 of the housing 1. Therefore, the good sealing performance can not be maintained.

On the other hand, in the case that the rubber hardness is harder than JIS A85, the insertion resistance of the lid member becomes larger, and it is impossible to smoothly insert the lid member.

Further, since downsizing of the lid member makes progress, a width a of the taper surface 32 is normally between 0.2 and 0.5 mm, and a distance b between the maximum diameter 331 of the seal portion 3 and the end portion in the inner portion X side of the seal portion 3 is between 0.3 and 0.6 mm.

As the rubber-like elastic material used in the seal portion 3, there can be listed up a nitrile rubber, an acrylic rubber, an EPDM, a CR, a silicone rubber, a fluorine-contained rubber, and a natural rubber, and they are appropriately selected and used in correspondence to various intended uses.

Further, as the resin material used in the lid member, there can be listed up an ABS resin, a polypropylene (PP), a polyethylene naphthalate (PEN), a polysulfone (PSF), a polyethylene (PE), a polystyrene (PS), an acrylic (PMMA), a polyethylene terephthalate (PET), a polyphenylene ether (PPE), a nylon/polyamide (PA), a polycarbonate (PC), a polyacetal (POM), a polybutylene terephthalate (PBT), a polyphenylene sulfide (PPS), a polyether ether ketone (PEEK), a liquid crystal polymer (LCP), a fluorine-contained resin, and an urethane resin, and they are appropriately selected and used in correspondence to various intended uses.

Figure 5:
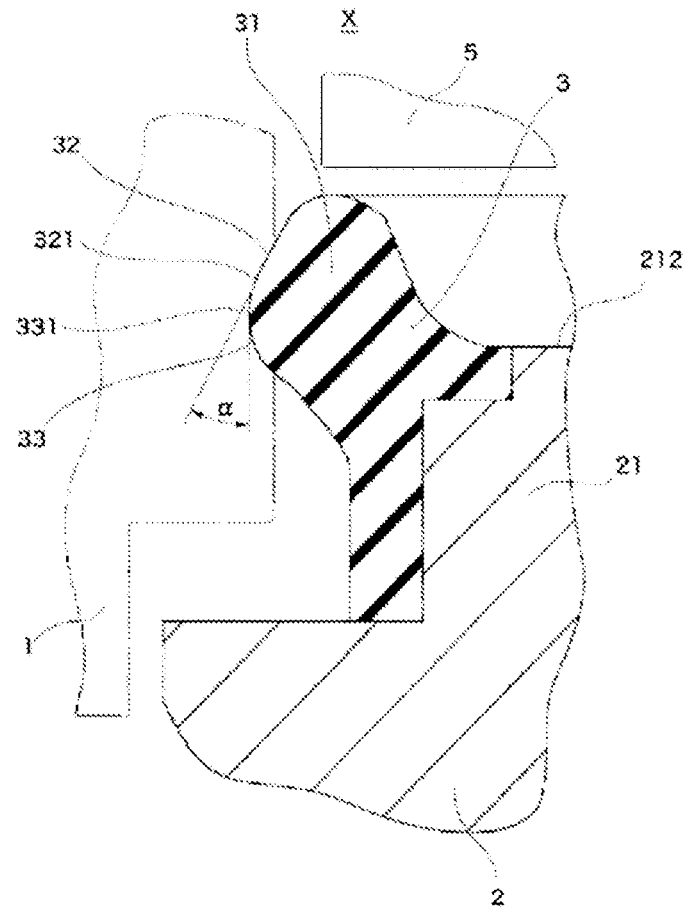
FIG. 5 is a view showing the other aspect of the lid member with the waterproofing function according to the present invention in the same manner as FIG. 2.
Figure 6:
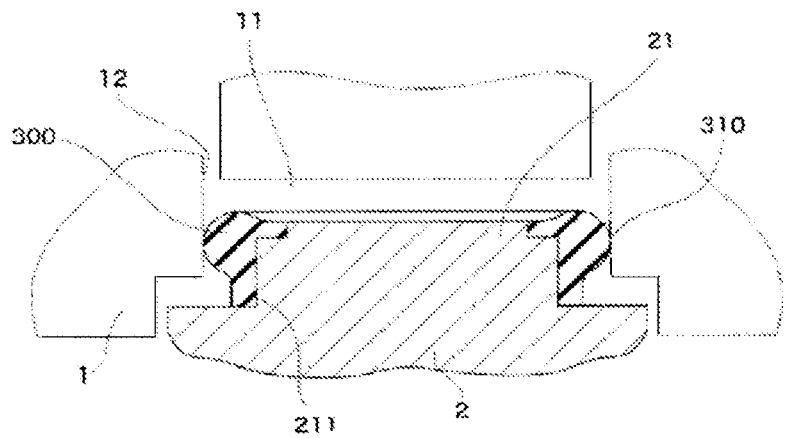
FIG. 6 is a vertical cross sectional view of a lid member with a waterproofing function according to a prior art.
Figure 7:
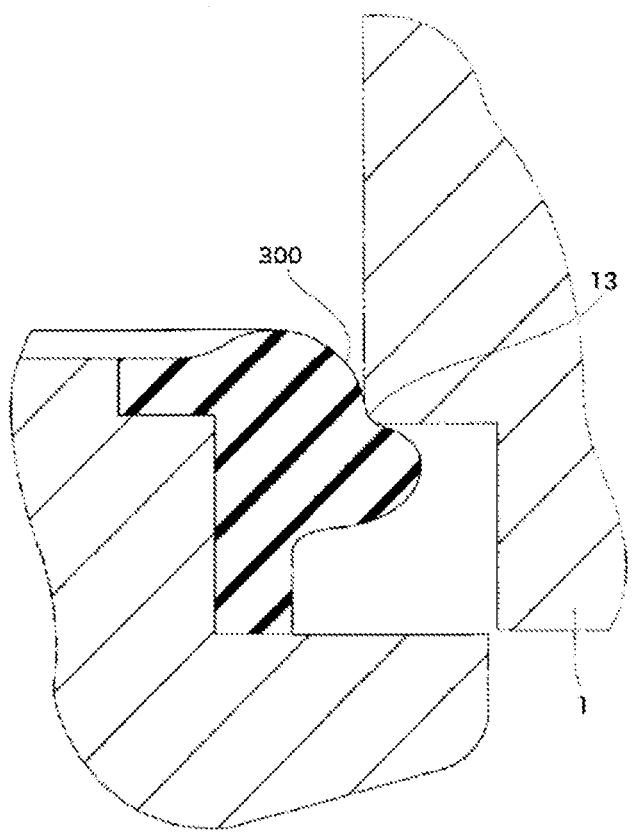
FIG. 7 is a partly enlarged view showing a deformed state of a seal portion in the case that the lid member in FIG. 6 is inserted into an opening portion.

A description will be given of the other lid member with the waterproofing function according to the present invention with reference to FIG. 5.

A different point from the lid member with the waterproofing function described above exists in a point that the annular projection 31 is designed to be longer so that the taper surface 32 and the maximum diameter 331 of the seal portion 3 are positioned further closer to the inner portion X side.

Accordingly, since the annular projection 31 is more easily deformed in an inner diameter direction, it is possible to further reduce the insertion resistance of the lid member. However, in the case that the sealed surface pressure of the seal portion 3 is lowered, a dimension in an axial direction is increased. Therefore, since a problem inhibiting the thin structure is brought about, it is not preferable to make the annular projection 31 so longer.

INDUSTRIAL APPLICABILITY

The lid member with the waterproofing function according to the present invention can be used for waterproofing the electronic device, particularly used in a waterproofing cell phone.

What is claimed is:

1. A lid member with a waterproofing function for opening and closing an opening portion formed in a housing, the lid member comprising:
    a resin main body accommodated in said opening portion;
    a projection portion which is integrally formed in one surface of said resin main body, said projection portion having a distal end surface and an outer peripheral surface; and
    an elastic seal portion which is integrally formed in said outer peripheral surface of said projection portion, said seal portion including an annular projection configured to abut an inner peripheral surface of said opening portion,
    wherein said annular projection is formed as a shape which is expanded toward an inner portion side of said housing in said opening portion, has a tapered outer peripheral surface which converges toward said inner portion side, and is provided with a seal surface having a circular arc shaped cross section extending from said tapered outer peripheral surface toward said resin main body, and
    wherein a maximum diameter of said seal surface is positioned closer to said inner portion side of said housing than said distal end surface.

2. The lid member with the waterproofing function according to claim 1, wherein said tapered outer peripheral surface first contacts said inner peripheral surface of said housing when said lid member closes said opening portion.

3. The lid member with the waterproofing function according to claim 2, wherein a taper angle which said tapered outer peripheral surface forms in relation to said inner peripheral surface of said housing is in a range between 20 and 50 degrees.

4. The lid member with the waterproofing function according to claim 3, wherein a rubber hardness of said seal portion is between JIS A55 and 85.

5. The lid member with the waterproofing function according to claim 2, wherein a rubber hardness of said seal portion is between JIS A55 and 85.

6. The lid member with the waterproofing function according to claim 1, wherein a taper angle which said tapered outer peripheral surface forms in relation to said inner peripheral surface of said housing is in a range between 20 and 50 degrees.

7. The lid member with the waterproofing function according to claim 6, wherein a rubber hardness of said seal portion is between JIS A55 and 85.

8. The lid member with the waterproofing function according to claim 1, wherein a rubber hardness of said seal portion is between JIS A55 and 85.

* * * * *